United States Patent
Fleischmann

(10) Patent No.: US 8,108,167 B2
(45) Date of Patent: Jan. 31, 2012

(54) METHOD FOR ASCERTAINING THE HARMONIC COMPONENTS OF AN ANALOG ELECTRICAL SIGNAL AT A FUNDAMENTAL FREQUENCY WHICH CHANGES OVER TIME

(75) Inventor: Thomas Fleischmann, Röthenbach (DE)

(73) Assignee: Siemens Aktiengesellschaft, Munich (DE)

( * ) Notice: Subject to any disclaimer, the term of this patent is extended or adjusted under 35 U.S.C. 154(b) by 608 days.

(21) Appl. No.: 12/292,461

(22) Filed: Nov. 19, 2008

(65) Prior Publication Data
US 2009/0144005 A1  Jun. 4, 2009

(30) Foreign Application Priority Data
Nov. 22, 2007 (DE) .................. 10 2007 056 605

(51) Int. Cl.
*G01R 23/16* (2006.01)

(52) U.S. Cl. ............ 702/77; 702/75; 341/120; 341/143; 341/155; 341/118

(58) Field of Classification Search .............. 702/75, 702/77; 455/67.14, 226.1; 341/120, 143, 341/155, 118, 156, 162, 50, 323, 157, 144; 375/270, 281, 331, 332
See application file for complete search history.

(56) References Cited

U.S. PATENT DOCUMENTS

| | | | | |
|---|---|---|---|---|
| 4,013,842 A * | 3/1977 | Kao et al. | ...................... | 370/307 |
| 5,068,657 A * | 11/1991 | Tsai | .............................. | 341/120 |
| 6,326,909 B1 * | 12/2001 | Yamaguchi | .................... | 341/120 |
| 6,333,706 B1 * | 12/2001 | Cummings et al. | ........... | 341/120 |
| 6,339,389 B1 * | 1/2002 | Zade | .............................. | 341/120 |
| 6,476,742 B2 * | 11/2002 | Yamaguchi | .................... | 341/120 |
| 6,580,380 B2 * | 6/2003 | Oh et al. | ...................... | 341/120 |
| 7,239,259 B1 * | 7/2007 | Xu | ................................. | 341/155 |
| 7,443,322 B2 * | 10/2008 | Compagne | .................... | 341/120 |
| 7,561,083 B2 * | 7/2009 | Anderson et al. | ............. | 341/120 |
| 7,907,078 B2 * | 3/2011 | Cheung | ......................... | 341/162 |
| 2004/0190911 A1 * | 9/2004 | Franco et al. | ................. | 398/189 |
| 2007/0111670 A1 * | 5/2007 | Compagne | ................. | 455/67.14 |

OTHER PUBLICATIONS

Ferrero, A. et al., "High Accuracy Fourier Analysis Based on Synchronous Sampling Techniques". IEEE Transactions on Instrumentation and Measurement, vol. 41, No. 6, Dec. 1992, pp. 780-785, passage I and II.

* cited by examiner

*Primary Examiner* — Carol Tsai
(74) *Attorney, Agent, or Firm* — Harness, Dickey & Pierce, P.L.C.

(57) ABSTRACT

A method includes ascertaining harmonic components of a periodic analog signal at a fundamental frequency which changes over time. The signal is digitized and fast Fourier transformed. A target signal is produced by modulating the signal using a first carrier frequency to form two frequency sidebands, the first carrier frequency being greater than the fundamental frequency of the signal. One of the two frequency sidebands of the modulated signal is filtered. The filtered frequency sideband is modulated using a second carrier frequency forming two frequency sidebands. The second carrier frequency is greater than the fundamental frequency of the signal. The difference between the second and first carrier frequencies is the same as the difference between the fundamental frequency and the target fundamental frequency. One of these two frequency sidebands is output as the target signal to calculate the fast Fourier transformation.

8 Claims, 1 Drawing Sheet

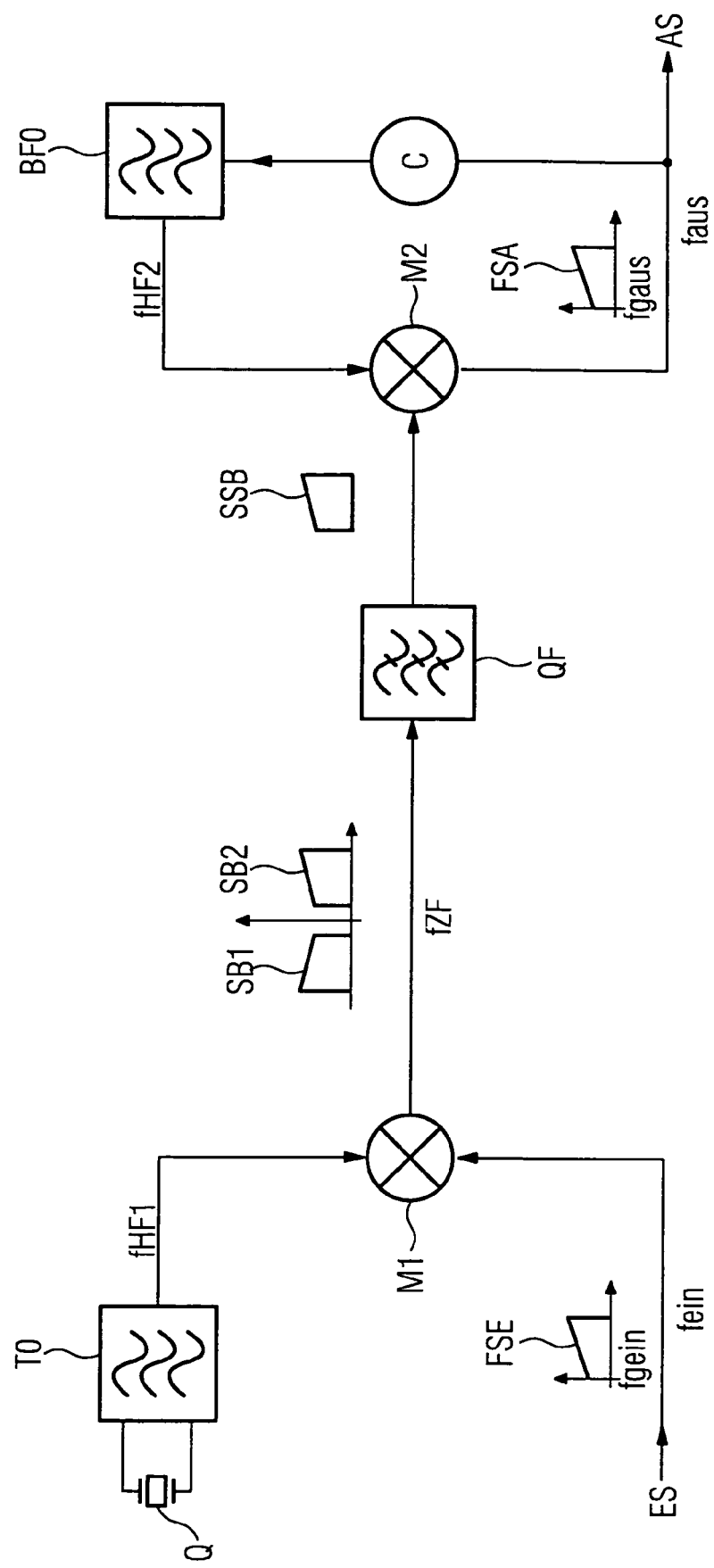

METHOD FOR ASCERTAINING THE HARMONIC COMPONENTS OF AN ANALOG ELECTRICAL SIGNAL AT A FUNDAMENTAL FREQUENCY WHICH CHANGES OVER TIME

PRIORITY STATEMENT

The present application hereby claims priority under 35 U.S.C. §119 on German patent application number DE 10 2007 056 605.2 filed Nov. 22, 2007, the entire contents of which is hereby incorporated herein by reference.

FIELD

Embodiments of the invention generally relates to a method for ascertaining the harmonic components of an analog electrical signal at a fundamental frequency which changes over time.

BACKGROUND

Methods for ascertaining the harmonic components of analog electrical signals are known. In this case, the analog signal is sampled and digitized at a sampling frequency, for example, so as then to use fast Fourier transformation FFT to calculate the Fourier transformation for the signal. This requires a fixed number of samples to be ascertained per period of time. For this reason, a fundamental frequency changing over time requires the sampling frequency to be continually tracked. In addition, the sampling system needs to be in tune with the maximum sampling frequency.

SUMMARY

In at least one embodiment of the invention, tracking the sampling frequency is avoided.

The solution of at least one embodiment provides for the analog signal at a fundamental frequency which changes over time to be taken as a basis for producing an analog target signal at a target fundamental frequency which is constant over time, the analog target signal then being digitized at the target fundamental frequency as the sampling frequency and being used instead of said analog signal to perform the fast Fourier transformation to ascertain the harmonic components of the analog signal, wherein the target signal is produced by modulating the analog signal using a first carrier frequency to form two frequency sidebands, the first carrier frequency being chosen to be greater, particularly several orders of magnitude greater, than the fundamental frequency of the analog signal, then filtering one of the two frequency sidebands out of the modulated analog signal, then modulating the filtered-out frequency sideband (as SSB signal) using a second carrier frequency to form two frequency sidebands again, the second carrier frequency being greater, particularly several orders of magnitude greater, than the fundamental frequency of the analog signal, and the difference between the second and first carrier frequencies respectively being the same as the discrepancy between the fundamental frequency and the target fundamental frequency, and outputting one of these two frequency sidebands as the analog target, signal which is to be produced. In this way, a fluctuating fundamental frequency is transformed into a target fundamental frequency which is constant over time. The sampling frequency is chosen to be equal to the target fundamental frequency, so that per period it is possible to perform sampling with a constant even number of samples.

BRIEF DESCRIPTION OF THE DRAWINGS

The invention is described in more detail below with the aid of an example embodiment.

The single FIGURE shows a schematic illustration of the method for ascertaining the harmonic components of an analog electrical input signal ES at the fundamental frequency fgein.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed, as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layers or section without departing from the teachings of the present invention.

The single FIGURE shows a schematic illustration of the method for ascertaining the harmonic components of an analog electrical input signal ES at the fundamental frequency fgein. In this case, the fundamental frequency fgein of the input signal ES fluctuates in the example embodiment between 45 and 60 Hz and is approximately 50 Hz on average. The harmonic components are ascertained by means of fast Fourier transformation (FFT) in a known manner using an output signal AS which is to be produced (target signal ZS, which has a constant fundamental frequency fgaus (target fundamental frequency fzg) of 55 Hz.

The input signal ES is at the frequency fein, which besides the fundamental frequency fgein respectively comprises the frequencies of the "harmonics", which are an integer multiple of the fundamental frequency fgein. The entire frequency spectrum FSE, including the fundamental frequency fgein, is shown schematically in the FIGURE.

In addition, a (first) oscillator TO (carrier oscillator) is provided which uses a crystal Q to produce a (first) signal (carrier signal) at a fixed frequency of 1 MHz, the (first) modulation frequency (carrier frequency) fHF1. The input signal ES is mixed with the (first) signal in a modulator M (is modulated with the carrier signal). Besides a carrier at the carrier frequency fHF1 of 1 MHz, the mixed signal at the frequency fZF has two sidebands SB1, SB2, as shown schematically in the FIGURE. The fundamental frequency of the sidebands SB1, SB2 is 1 MHz−fgein or 1 MHz+fgein (that is to say for fgein=50 Hz 1 MHz−50 Hz or 1 MHz+50 Hz).

The (first) modulation frequency fHF1 differs from the fundamental frequency fgein of the analog signal ES by more than 4 orders of magnitude; it must be at least greater than the fundamental frequency fgein, where possible several orders of magnitude, as in this case in the exemplary embodiment.

A steep-edged crystal filter QF is used to filter out one of the two frequency sidebands (in this case the frequency sideband SB1) and the carrier at the carrier frequency fHF1, so that downstream of the crystal filter QF there is now only the frequency sideband SB2 as an "SSB" (Single Side Band) signal, which effectively lacks the reference to the fundamental frequency fgein as a result of the absence of the carrier. (For an SSB signal which has been produced beforehand by modulation with a carrier at a frequency of 1 MHz, an offset in the SSB signal of 1 MHz is also referred to.)

The SSB signal is modulated (mixed) with a (second) modulation frequency fHF2 of a (second) oscillator BFO (Beat Frequency Oscillator) using a (second) modulator M2 (often also called product detector), which produces a low-frequency output signal AS with a frequency spectrum FSA for a fundamental frequency fgaus.

Regulation of the (second) oscillator BFO by means of a controller C is used to set the modulation frequency fHF2 in each case such that the output signal AS is at a fixed fundamental frequency fgaus. The controller C calculates the required controlled variable from the output signal AS (e.g. by means of signal analysis).

The possibility of obtaining an output signal AS at a fixed fundamental frequency fgaus is obtained by virtue of the fundamental frequency fgaus respectively changing, after the (second) modulation, with the interval between the (second) modulation frequency fHF2 and the SSB signal (sideband).

In other words, the regulation ensures that the difference from the second and the first modulation frequency (carrier frequency) fHF1, fHF2 is respectively the same as the discrepancy between the fundamental frequency fgein and the fundamental frequency fgaus.

This method is thus used to transform the fluctuating fundamental frequency fgein into a constant fundamental frequency fgaus.

In the example embodiment in this case, the modulation frequency fHF2 is respectively tracked (regulated) such that the fundamental frequency fgaus of the mixed frequency faus is constantly 55 Hz in each case.

The output of the output signal AS at the constant fundamental frequency fgaus of 55 Hz means that one of the two frequency sidebands delivers the analog target signal ZS to be produced at a constant target fundamental frequency fzg.

This target signal ZS is digitized at the constant target fundamental frequency fzg as the sampling frequency and is used to calculate the fast Fourier transformation. This is then used to calculate the harmonic components of the target signal ZS, which correspond to those of the input signal ES.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for ascertaining harmonic components of a periodic analog signal at a fundamental frequency which changes over time, the method comprising:

using the analog signal to produce an analog target signal at a target fundamental frequency which is constant over time, the analog target signal being produced by, modulating the analog signal using a first carrier frequency to form two frequency sidebands, the first carrier frequency being chosen to be relatively greater than the fundamental frequency of the analog signal, filtering one of the two frequency sidebands out of the modulated analog signal, modulating the filtered-out frequency sideband using a second carrier frequency to form two frequency sidebands again, the second carrier frequency being greater than the fundamental frequency of the analog signal, and a difference between the second and first carrier frequencies respectively being the same as a discrepancy between the fundamental frequency and the target fundamental frequency, and outputting one of the two frequency sidebands as the produced analog target signal;

digitizing the produced analog target signal, using the target fundamental frequency as a sampling frequency, to produce digitized samples; and fast Fourier transforming the digitized target signal to ascertain the harmonic components using the digitized samples.

2. The method of claim 1, wherein the first carrier frequency is chosen to be several orders of magnitude greater than the fundamental frequency of the analog signal.

3. The method of claim 1, wherein the second carrier frequency is several orders of magnitude greater than the fundamental frequency of the analog signal.

4. The method of claim 2, wherein the second carrier frequency is several orders of magnitude greater than the fundamental frequency of the analog signal.

5. A non-transitory computer readable medium including program segments for, when executed on a computer device, causing the computer device to implement the method of claim 1.

6. A non-transitory computer readable medium including program segments for, when executed on a computer device, causing the computer device to implement the method of claim 2.

7. A non-transitory computer readable medium including program segments for, when executed on a computer device, causing the computer device to implement the method of claim 3.

8. A non-transitory computer readable medium including program segments for, when executed on a computer device, causing the computer device to implement the method of claim 4.

* * * * *